(12) United States Patent
Dutta (10) Patent No.: US 7,902,453 B2
(45) Date of Patent: *Mar. 8, 2011

(54) EDGE ILLUMINATION PHOTOVOLTAIC DEVICES AND METHODS OF MAKING SAME

(75) Inventor: Partha Dutta, Clifton Park, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 1043 days.

This patent is subject to a terminal disclaimer.

(21) Appl. No.: 11/493,921

(22) Filed: Jul. 27, 2006

(65) Prior Publication Data

US 2007/0034250 A1 Feb. 15, 2007

Related U.S. Application Data

(60) Provisional application No. 60/702,921, filed on Jul. 27, 2005.

(51) Int. Cl.
*H01L 51/48* (2006.01)
*H01L 51/44* (2006.01)

(52) U.S. Cl. ......... 136/255; 136/252; 136/262; 136/256; 257/431; 257/443; 257/448; 117/81

(58) Field of Classification Search .................. 136/243, 136/252, 255, 259, 256, 262, 261; 117/11, 117/16, 209, 81; 257/431, 443, 448
See application file for complete search history.

(56) References Cited

U.S. PATENT DOCUMENTS

| | | | | | |
|---|---|---|---|---|---|
| 4,023,118 | A | * | 5/1977 | Kessler et al. | 372/44.01 |
| 4,042,417 | A | * | 8/1977 | Kaplow et al. | 136/246 |
| 4,174,561 | A | * | 11/1979 | House et al. | 438/65 |
| 4,332,973 | A | | 6/1982 | Sater | |
| 4,409,422 | A | | 10/1983 | Sater | |
| 4,516,314 | A | * | 5/1985 | Sater | 438/67 |
| 5,759,909 | A | * | 6/1998 | Goebel et al. | 438/558 |
| H1856 | H | * | 9/2000 | Baldasaro et al. | 136/258 |
| 6,281,427 | B1 | * | 8/2001 | Mitsuhiro et al. | 136/250 |
| 6,613,162 | B1 | | 9/2003 | Dutta et al. | |
| 7,641,733 | B2 | * | 1/2010 | Dutta | 117/13 |
| 2004/0223528 | A1 | * | 11/2004 | Wortman et al. | 372/44 |
| 2006/0112984 | A1 | * | 6/2006 | Walukiewcz et al. | 136/252 |
| 2008/0203361 | A1 | * | 8/2008 | Dutta | 252/518.1 |

FOREIGN PATENT DOCUMENTS

WO WO 2006/028868 A2 3/2006

OTHER PUBLICATIONS

Chadda et al., "The effect of surface recombination velocity on the performance of vertical multi-junction solar cell," $9^{th}$ IEEE Photovoltaic Specialists Conference, Silver Spring, MD, 1972, pp. 87-90.

(Continued)

*Primary Examiner* — Jennifer K Michener
*Assistant Examiner* — Jayne Mershon
(74) *Attorney, Agent, or Firm* — Foley & Lardner LLP (57) ABSTRACT

Edge illumination photovoltaic devices based on multicomponent semiconductors and low cost methods for fabricating such devices are provided. The photovoltaic devices can find application in a variety of photovoltaic and thermophotovoltaic systems including solar concentrator based systems.

7 Claims, 5 Drawing Sheets

OTHER PUBLICATIONS

Dutta, "The physics and technology of gallium antimonide: An emerging optoelectronic material," J. Appl. Phys., 81 (9), May 1, 1997, pp. 5821-5870.

Goradia et al., "Characteristics of high intensity (HI) edge-illuminated multijunction silicon solar cells—experimental results and theory," $12^{th}$ Photovoltaic Specialists Conference, Baton Rouge, LA, Nov. 1976, pp. 781-788.

Goradia et al., "Recent experimental results on high intensity (HI) edge-illuminated multijunction silicon solar cells," $12^{th}$ Photovoltaic Specialists Conference, Baton Rouge, LA, Nov. 1976, pp. 789-790.

Hu et al., "New analysis of a high-voltage vertical multijunction solar cell," J. Appl. Phys., 48 (1), Jan. 1, 1977, pp. 442-444.

Kunitsyna et al., "Growth of $Ga_{1-x}In_xAs_ySb_{1-y}$ solid solutions from the five component Ga-In-As-Sb-Pb melt by liquid phase epitaxy," Applied Surface Science, 142, 1999, pp. 371-374.

Rahilly, W. Patrick, "Vertical multijunction solar cells," $9^{th}$ IEEE Photovoltaic Specialists Conference, May 1972, pp. 44-52.

Rajagopalan et al., "A Simple Single-Step Diffusion and Emitter Etching Process for High-Efficiency Gallium-Antimonide Thermophotovoltaic Devices," J. Elect. Mat., 32(11), 2003, pp. 1317-1321.

Sater et al., "The multiple junction edge illuminated solar cell," $10^{th}$ IEEE Photovoltaic Specialists Conference, Palo Alto, CA, Nov. 1973, pp. 188-193.

Sater et al., "High Voltage Silicon VMJ Solar Cells for up to 1000 Suns Intensities," Photovoltaic Specialists Conference, 2002, Conference Record of the $29^{th}$ IEEE, pp. 1019-1022.

Smeltzer et al., "Vertical multijunction solar cell fabrication," $10^{th}$ IEEE Photovoltaic Specialists Conference, Palo Alto, CA, Nov. 1973, pp. 194-196.

Soukup, R. J., "The lensed high-voltage vertical multijunction solar cell," J. Appl. Phys., 48(1), Jan. 1, 1977, pp. 440-441.

Soukup, R. J., "Reply to 'New analysis of a high-voltage vertical multijunction solar cell," J. Appl. Phys., 48(1), Jan. 1, 1977, pp. 445.

Stella et al., "Vertical Multijunction Solar Cell," $9^{th}$ IEEE Photovoltaic Specialists Conference, May 1972, pp. 85-86.

\* cited by examiner

EDGE ILLUMINATION PHOTOVOLTAIC DEVICES AND METHODS OF MAKING SAME

CROSS-REFERENCE TO RELATED PATENT APPLICATIONS

This application claims benefit of priority of U.S. Provisional Patent Application No. 60/702,921, filed Jul. 27, 2005, incorporated herein by reference in its entirety.

STATEMENT FOR FEDERALLY FUNDED RESEARCH

Aspects of the present invention were developed with U.S. government support under National Science Foundation grant number ECS 0093706. The government has certain rights in this invention.

FIELD

The present invention relates generally to photovoltaic devices and their methods of making and more specifically to edge illumination photovoltaic devices and their methods of making.

BACKGROUND

An edge illuminated photovoltaic device, also known as a vertical photovoltaic device, is a photovoltaic device, in which light illuminates a p-n junction through the edge of the device, i.e. in the direction substantially non-parallel, to the direction defined by the device's electrical contacts to the outer surface. One advantage of edge illuminated photovoltaic devices is elimination of the need for transparent front and/or back contacts. Another advantage is the ability to connect several of individual single junction photovoltaic cells in series to form a multijunction device. Such series connection capability can provide a high voltage, low current operation with a better compatibility to power processing loads and a high tolerance to series resistance values within the electrical system. Edge illumination photovoltaic devices are often designed for use with concentrating solar collectors. Edge illumination photovoltaic devices are disclosed, for example, in R. J. Soukup, Journal of Applied Physics, vol. 48, p. 440, 1977; C. Hu et. al. Journal of Applied Physics, vol. 48, p. 442, 1977; R. J. Soukup, Journal of Applied Physics, vol. 48, p. 445, 1977.

Two of the requirements for a commercial photovoltaic device are high efficiency and low cost. The inventor believes that one example of device that came close to satisfying these requirements is an edge illumination photovoltaic device by PhotoVolt, Inc., Strongsville, Ohio, (see e.g. B. L. Sater and N. D. Sater "High Voltage Silicon VMJ Solar Cells for up to 1000 Suns Intensities", Photovoltaic Specialists Conference, 2002, Conference Record of the Twenty-Ninth IEEE, pp. 1019-1022; and U.S. Pat. Nos. 4,332,973, 4,409,422 and 4,516,314, all incorporated herein by reference in their entirety). Although low cost, non-optimized "working model" of this silicon based device can achieve nearly 20% efficiency at 332 suns (33.2 watts/cm$^2$), the device's theoretical efficiency of >30% at 1000 suns was not attained due to manufacturing issues associated with metallization and fabrication of multiwafer stacks.

Thus, a need exists to develop alternative low cost methods for making edge illumination photovoltaic devices.

SUMMARY

One embodiment of the invention provides a method of making an edge illumination device without using an epitaxial process. The method comprises (i) forming at least one p-n junction in at least one multicomponent semiconductor region having a first end surface and a second end surface substantially parallel to said first end surface; (ii) forming an illumination surface in the at least one region, wherein the illumination surface is located substantially non-parallel to the first end surface and the second end surface; and (iii) forming a first electrode which electrically contacts the first end surface and a second electrode which electrically contacts the second end surface.

Another embodiment of the invention provides an edge illumination photovoltaic device, comprising (A) a single crystal boule that comprises a first end surface and a second end surface and at least one illumination surface, wherein the first end surface and a second end surface are substantially parallel to each other and wherein the illumination surface is substantially perpendicular to said first and second end surfaces, wherein the single crystal boule comprises a first p-type region and a second n-type region which form a p-n junction; and (B) an electrical connection to each of the first end surface and the second end surface.

Yet another embodiment of the invention provides an edge illumination photovoltaic device, comprising (A) at least one p-n junction in at least one multicomponent semiconductor region having a first end surface, a second end surface substantially parallel to said first end surface, and an illumination surface that is substantially perpendicular to said first and second end surfaces, wherein the at least one p-n junction comprises a first single crystal layer of a first conductivity type and a second amorphous layer of a second conductivity type; and (B) an electrical connection to each of the first and second end surfaces.

Yet another embodiment of the invention provides an edge illumination photovoltaic device, comprising (A) at least one p-n junction in at least one multicomponent semiconductor region having a first end surface, a second end surface substantially parallel to said first end surface, and an illumination surface that is substantially perpendicular to said first and second end surfaces, wherein the at least one p-n junction comprises diffused p-n junction; and (B) an electrical connection to each of the first and second end surfaces.

DETAILED DESCRIPTION

The present inventor developed novel edge illumination photovoltaic devices based on multicomponent semiconductors and low cost methods for their making.

A multicomponent semiconductor is a semiconductor that has two or more elements. Advantages of using multicomponent semiconductors include their low growth temperature that requires less energy to produce compared to silicon high growth temperature as well as superior electrical and optical properties compared to silicon. For example, one can tune a multicomponent semiconductor's bandgap to maximize an efficiency of the edge illuminated device at a specific concentration ratio of the sunlight.

Fabrication of an edge illumination photovoltaic device involves forming one or more regions, each of which comprises a multicomponent semiconductor p-n junction, forming an illumination surface substantially non-parallel, preferably substantially perpendicular to a first end surface and a second end surface of the device and providing an electrical connection to each of the first and the second end surfaces. In other words, the illumination direction is substantially parallel to the plane of the p-n junction and the illumination surface is substantially perpendicular to this plane. Fabrication can be performed without using photolithography or costly high temperature processing techniques, such as epitaxial growth.

The multicomponent semiconductor can be a III-V or II-VI compound semiconductor. Exemplary multicomponent semiconductors are binary semiconductors, such as GaSb, GaAs, and InP, ternary semiconductors, such as GaInAs, GaInSb, GaInP, AlGaAs, AlGaSb, AlGaP, AlInAs, AlInSb, AlInP, InAsSb, InAsP, InSbP, GaAsSb, GaAsP, GaSbP, AlAsSb, AlAsP, AlSbP, ZnTeSe, ZnTeS, ZnSeS, CdTeSe, CdTeS, CdSeS, HgTeSe, HgTeS, HgSeS, ZnCdTe, ZnCdSe, ZnCdS, ZnHgTe, ZnHgSe, ZnHgS, CdHgTe, CdHgSe, and CdHgS and quaternary semiconductors, such as GaInAsSb, GaInAsP, GaInSbP, AlGaAsSb, AlGaAsP, AlGaSbP, AlInAsSb, AlInAsP, AlInSbP, ZnCdTeSe, ZnCdTeS, ZnCdSeS, HgCdTeSe, HgCdTeS, HgCdSeS, ZnHgTeSe, ZnHgTeS, and ZnHgSeS.

According to a first embodiment, the first step in fabricating an edge illumination photovoltaic device is providing a wafer having a uniform composition of a multicomponent semiconductor. The wafer can be obtained either from a commercial source or by first growing a single crystal boule having a uniform composition of the multicomponent semiconductor and then slicing the boule substantially perpendicular to the crystal growth's direction. A plurality of methods exist for growing binary semiconductors having a specific bandgap and lattice constant. For growing single crystal boule of ternary, quaternary single crystals having a specific band gap and lattice constant one can utilize methods disclosed in U.S. Pat. No. 6,613,162 issued Sep. 2, 2003 and PCT publication No. WO2006/028868 published on Mar. 16, 2006, incorporated herein by reference in their entirety. The multicomponent semiconductor can be doped with a first dopant, i.e. a material that may impart desirable properties (e.g., desirable electrical and optical properties) to the multicomponent semiconductor. The first dopant can be any material which is commonly used in conventional binary, ternary, quaternary semiconductors. Examples of III-V semiconductor dopants include n-type dopants, such as Te, Se, and S, and p-type dopants, such as Zn, Cd, and the like. Preferably, the n-type or p-type dopant is used in an amount effective to make the semiconductor a n-type or p-type semiconductor, respectively.

To form a p-n junction in the obtained wafer, the wafer can be doped with a dopant which is of the opposite type to the doping type of the wafer. For example, to form a p-n junction, for the n-doped wafer a p-type is used, while for a p-doped wafer an n-type dopant is used.

In the first embodiment, the doping is performed by diffusing a dopant into a substrate, such as semiconductor wafer.

The wafer can be diffusion doped by being exposing the wafer to a vapor comprising the second dopant using, for example, a process disclosed in G. Rajagopalan, N. S. Reddy, H. Ehsani, I. B. Bhat, P. S. Dutta, R. J. Gutmann, G. Nichols, G. W. Charache, O. Sulima, "A Simple Single Step Diffusion and Emitter Etching Process for Low Cost, High Efficiency Gallium Antimonide Thermophotovoltaic Devices", J. Electronic Materials 32 (11), 1317-1321, incorporated herein by reference in its entirety. The diffusive doping can last from 0.5 to 8 hours or from 1 hour to 6 hours at a temperature from around 400° C. to around 600° C. or from around 450° C. to around 550° C. A particular temperature and a particular time for diffusive doping are selected based on the doping material, the depth of diffusion desired and of the properties of the multicomponent semiconductor substrate. Prior to diffusion, the wafer should be degreased by using appropriate solvent such as xylene, acetone and/or methanol and then stripped of its native oxide layer using, for example, HCl.

Upon the formation of the p-n junction, one or more metallic layers are deposited on each side of the wafer by either thermal evaporation or e-beam process to provide ohmic contacts. Each of the metallic layers can comprise metals such as Au, Ti, Sn, In, Pt or any combination thereof. In some cases, the ohmic contact can comprise multiple layers of metal such as a Ti/Au or Au/Sn stack.

If the final photovoltaic device includes multiple p-n junctions, the wafers containing a p-n junction are stacked interposing a layer of a low temperature bonding material between adjacent surfaces of the wafers followed by annealing the stacked structure to form an integrally bonded structure. The low temperature bonding material can be any metal or alloy that melts at a temperature below 450° C., preferably below 250° C. Examples of such bonding materials include soldering materials, such as In, Sn and low temperature alloys comprising In, Sn and/or Ag.

Upon its formation, the integrally bonded structure is sliced or planarized to expose one or more edges surfaces that are substantially non-parallel, preferably substantially perpendicular, to the end surfaces of the structure. Each of the edge surface can be then polished or chemically treated. The edge surface that serves as an illumination surface, i.e. a surface which is exposed to light, can be then coated with one or more antireflection layers using processes known to those skilled in the art. The edge surface that serves as a heat dissipating surface can be then coated with a layer of material that is thermally conducting but electrically insulating and connected to a proper heat sink. Preferably, the heat dissipating surface is opposite to the illumination surface. If the photovoltaic device has only one p-n junction, stacking and annealing of the wafers is not necessary. Therefore, slicing or planarizing and subsequent formation of the illumination and heat dissipation surfaces can occur right after depositing metal layers on the surfaces of the wafer.

Finally, electrical connections, such as metal wires, are applied to the end surfaces of the device. For a multiple p-n junction device, such end surfaces will be the surfaces of the metal layers deposited on the first and the last wafer in the stack. For a single p-n junction device, the end surfaces are the surfaces of the metal layers deposited on the wafer.

Figure 1:
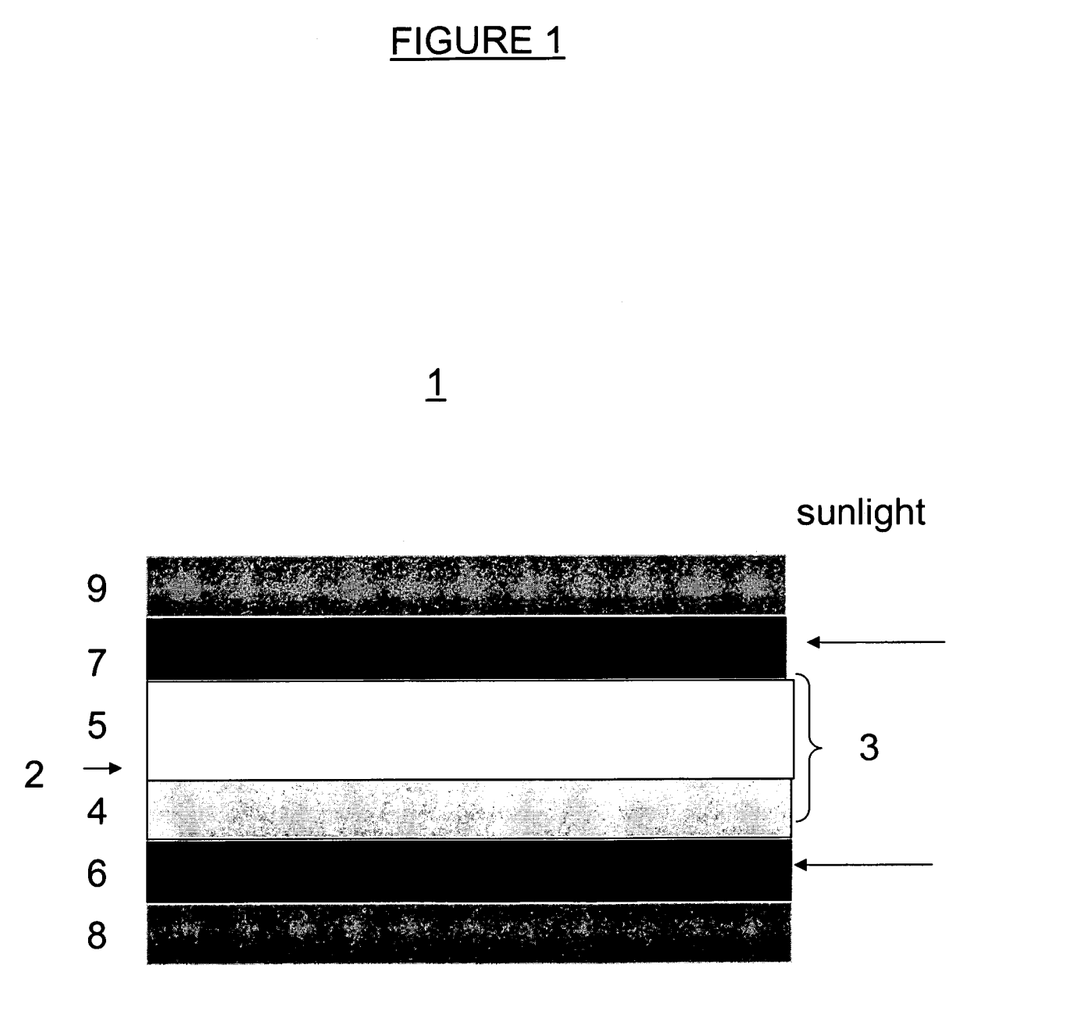
FIG. 1 shows a side cross-section view of an edge illumination device according to one embodiment of the invention.

FIG. 1 illustrates an edge illumination photovoltaic device that can be fabricated as described above. Wafer 3 having a first and a second surface (lower and upper surfaces respectively) is diffusively doped so that it contains layers 4 and 5, one of which is p-doped and the other is n-doped to form a p-n junction 2. Either layer 4 or layer 5 is formed by diffusing a dopant of one conductivity type into a wafer 3 of the opposite conductivity type. One or more metal layers 6 are deposited on the first surface of the wafer, while one or metal layers 7 are deposited on the second surface of the wafer. Bonding layers 8 and 9 are optionally deposited on metal layers 6 and 7, respectively, for formation of a multijunction device. The direction of sunlight illumination is indicated with the arrows.

Figure 2:
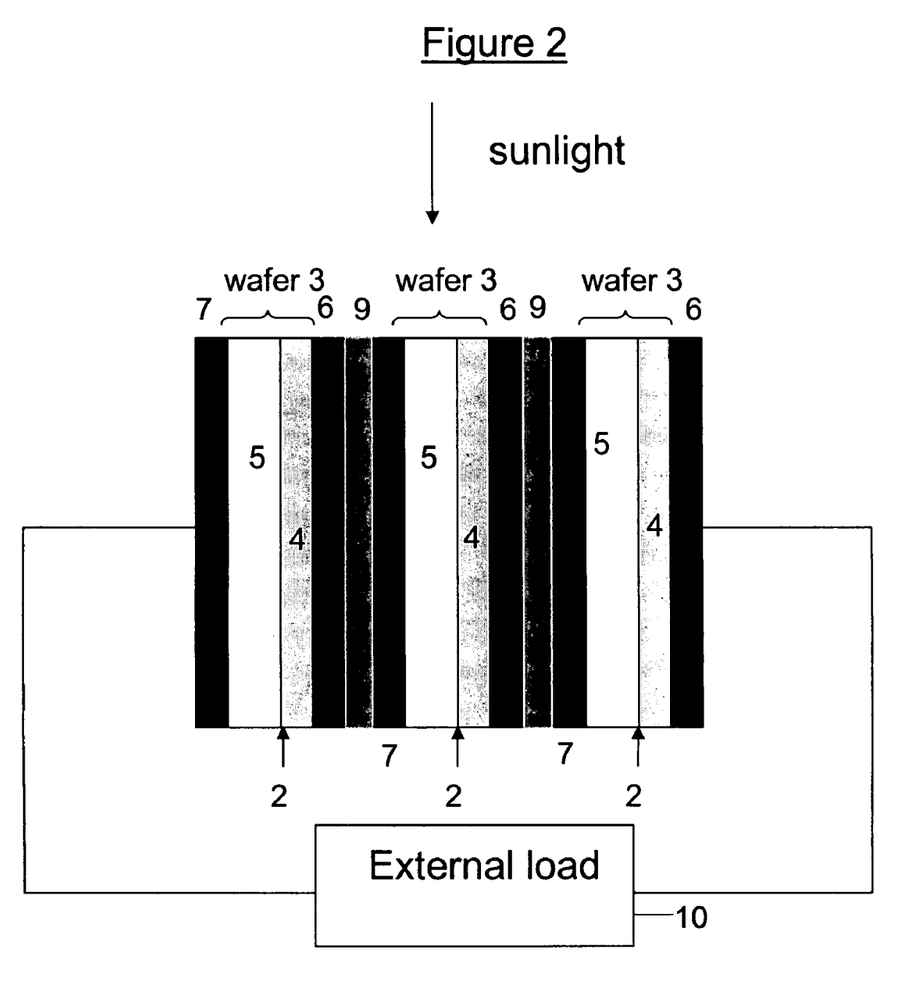
FIG. 2 shows a multijunction edge illumination photovoltaic device connected to an external load according to one embodiment of the invention.

FIG. 2 illustrates a photovoltaic device connected to an external load 10. The device contains three p-n junctions 2. Each wafer 3 can comprise a different multicomponent semiconductor material with a different bandgap. Thus, one wafer may contain semiconductor material which is most sensitive to blue component of the sunlight due to its bandgap. The second wafer may contain material which is most sensitive to yellow or green component of the sunlight, and the third wafer may contain material which is most sensitive to the orange or red component of the sunlight. In general, a multijunction photovoltaic device can be formed by stacking wafers of different semiconductor materials which have peak sensitivity to different wavelength components of the sunlight. The multijunction device can have two, three, four or more junctions.

According to a second embodiment, an edge illumination photovoltaic device is fabricated by diffusion from a solid diffusion source. A stack structure comprising homogeneous multicomponent semiconductor wafers interspersed with foils, such as metal foils, is formed. The stack structure includes at least a first wafer comprising a first multicomponent semiconductor and a second wafer comprising a second multicomponent semiconductor. The first multicomponent semiconductor can be the same or different from the second multicomponent semiconductor. Preferably, each of the multicomponent semiconductor wafers in the stack is a doped multicomponent semiconductor wafer.

The metal foils include dopant foils, ohmic contact foils and at least one interconnect/bonding foil. Each of the dopant foils are used for doping one of the multicomponent semiconductor wafers in order to form a diffused p-n junction. Accordingly, the dopant foil directly contacting a p-doped multicomponent semiconductor wafer comprises an n-type dopant such as tellurium or selenium, while the dopant foil directly contacting an n-doped multicomponent semiconductor wafer comprises a p-type dopant such Zn, Cd or the like.

Each of the ohmic contacts foils is used for forming an ohmic contact on one of the wafers. Accordingly, each ohmic contact foil comprises metals such as Au, Ti, Sn, In, Pt or any combination thereof.

The interconnecting/bonding foil is used for connecting wafers in the stacked structure. The interconnecting/bonding foil can comprise a low temperature soldering material such as In, Sn and low temperature alloys comprising In, Sn and/or Ag. Each of the metal foils can have a thickness from 5 microns to 1 mm.

The metal foils are arranged with respect to the wafers in such a manner that each of the wafers has one dopant foil and at least two ohmic contact foils (first and second) associated with it. The dopant foil and the first ohmic contact foil are in direct contact with a first surface and an opposite second surface of the wafer respectively. The second ohmic contact foil is in direct contact with the dopant foil. In some cases, more than two ohmic contact foils can be associated with each of the wafers. Such additional foils can be stacked in direct contact with the first and/or the second ohmic contact foils. The bonding foil is used for interconnecting two adjacent wafers of the device, accordingly the bonding foil is interposed between one of the ohmic contact foils associated with the first wafer and one the ohmic contact foils with second wafer.

Figure 3:
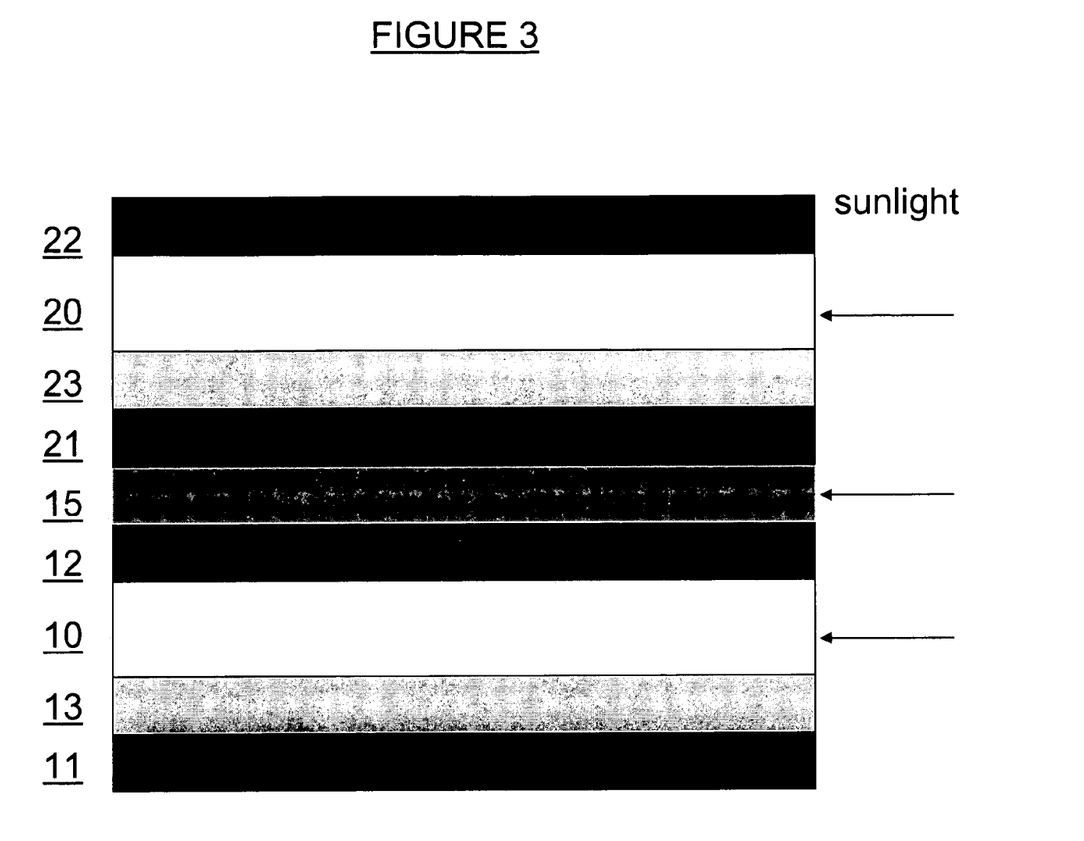
FIG. 3 illustrates a stacked structure according to one embodiment of the invention.

FIG. 3 illustrates the stacking arrangement. Wafer 10 is in direct contact with a dopant foil 13 and a first ohmic contact foil 12. A second ohmic contact foil 11 is in direct contact with the dopant foil 13. Similarly, wafer 20 is in direct contact with a dopant foil 23 and a first ohmic contact foil 22. A second ohmic contact foil 21 is in direct contact with the dopant foil 23. A bonding foil 15 is interposed between wafers 10 and 20 in direct contact with ohmic contact foils 12 and 21. Each of the foils 22, 21, 12 and 11 in FIG. 3 can represent a one layer ohmic contact foil or a multilayer ohmic contact foil.

Upon its formation, the stacked structure is annealed to form an integrally bonded structure. Annealing can be performed at a temperature below around 600° C., preferably at a temperature below around 450° C. The specific temperature and specific time of annealing depend on specific materials of the foils. Annealing of the stacked structure can perform three functions in a single process: 1) it can dope each of the wafers via diffusion of material of the dopant foil into the multicomponent wafer so that a diffused p-n junction is formed in the wafer; 2) it can form ohmic contacts on each of the wafers from the ohmic contact foils and 3) it can interconnect the wafer via bonding foil.

Following the annealing, the integrally bonded structure can sliced substantially non-parallel, preferably substantially perpendicular, to the end surfaces of the structure to form one or more edge surfaces. As in the previous embodiment, each of the edge surface can be then polished or chemically treated. The edge surface that serves as an illumination surface, i.e. a surface which is exposed to the sunlight, can be then coated with one or more antireflection layer using processes known to those skilled in the art. The edge surface that serves as a heat dissipating can be then coated with a layer of material that is thermally conducting but electrically insulating and connected to a proper heat sink. Preferably, the heat dissipating surface is opposite to the illumination surface.

Electrical connections, such as metal wires, are applied to each of the end surfaces of the device, i.e. surfaces of the ohmic contacts associated with the first and the last wafer in the structure that do not face another wafer of the structure.

According to a third embodiment, an edge illumination photovoltaic device is formed by growing a single crystal boule of a multicomponent semiconductor that includes one or more p-n junctions, using a crystal growth seed from a multicomponent melt according to a technique disclosed in the PCT publication No. WO2006/028868 published on Mar. 16, 2006, incorporated herein by reference in its entirety.

The grown single crystal boule can be preferably substantially free from crystal defects. The crystal is considered to be "substantially free from crystal defects" when it has fewer than about $10^6$ crystal defects (e.g., cracks, inclusions, precipitates, dendrites, and/or dislocations) per $cm^2$, such as when it has fewer than $10^5$ crystal defects per $cm^2$, such as when it has fewer than $10^4$ crystal defects per $cm^2$, such as when it has fewer than $10^3$ crystal defects per $cm^2$, such as when it has fewer than 100 crystal defects per $cm^2$. The dislocation may be measured using an etch pit density method and the other defects, such as dendrites or inclusions may be measured by chemical etching using various acid-base mixtures.

In some cases, the crystal growth seed can comprises a single crystal of the same semiconductor as that being grown.

For example, to grow a ternary $Ga_{0.75}In_{0.25}Sb$ single crystal, the crystal growth seed would be a $Ga_{0.75}In_{0.25}Sb$ single crystal seed.

Yet in some cases, a binary crystal growth seed can be used to grow a ternary or quaternary crystal growth seed first.

Although each of the multicomponent melt and multicomponent semiconductor contain more than one element or component, the melt and the semiconductor do not necessarily have the same number of elements or components. For example, if desired, a higher order melt may be used for a lower order single crystal, as described for example in U.S. Pat. No. 6,613,162 (quaternary melt for ternary crystal) and E. V. Kunitsyna et. al., 142 Appl. Surf. Sci. 371-374 (1999) (quinternary melt for quaternary crystal) both incorporated herein by reference in their entirety.

The technique of the PCT publication No. WO2006/028868 allows growing the single crystal boule that may have one or more types of layers or regions stacked in the boule's axial direction in any combination, where the term "type" includes: i) doping type (p or n); ii) doping concentration type (heavy, medium, light or intrinsic); iii) material type (such as AlGaSb, GaAs and/or GaSb, for example); and iv) relative element concentration type (i.e., $Ga_{1-x}In_xSb$ and $Ga_{1-y}In_ySb$, where $0<x$, $y<1$ and x does not equal y, which can be generalized to $A_{1-x}D_xE$ and $A_{1-y}D_yE$ (where the concentration of group III element is varied), or $AD_{1-x}E_x$ and $AD_{1-y}E_y$ (where the concentration of group V element is varied, such as $GaAs_{1-x}P_x$ and $GaAs_{1-y}P_y$) for ternary materials where A, D and E are elements found in ternary materials). In other words, a single crystal boule may have two or more layers or axial regions with different characteristics, where all of the layers with different characteristics may be of the same or different types.

The resulting crystal boule can have one or more p-n junctions which may be formed between, for example, the crystal growth seed and the first layer grown or between subsequently grown layers. For example, the boule may have p+/p/n/n+ layers stacked together in the direction of the boule's growth. The differently doped layers (by doping type and doping concentration type) may also be made of different multicomponent semiconductor materials and/or may have different relative concentration of elements. The different layers grown according to the technique of the PCT publication No. WO2006/028868 do not include a boundary between layers which is found in devices in which one layer is epitaxially grown over another layer or substrate.

In brief, a method of WO2006/028868 publication is a method of growing a multi-component single crystal having three or more elements with high quality and high growth rate by growing the single crystal on a crystal growth seed from a multi-component melt, such as a ternary, quaternary or higher order (i.e., quinternary) melt. It should be noted that the crystal and melt do not necessarily have the same number of elements or components. The crystal growth seed is located in a crystal growth area of a vessel, such as a crucible or another suitable vessel. The vessel is separated into a crystal growth area and a synthesizing melt area by a thermal barrier. At least one opening connects the crystal growth area to the synthesizing melt area. A growth melt is formed in the crystal growth area of the vessel and a synthesizing melt is formed in the synthesizing melt area of the vessel. A solute, such as a solid or liquid solute is provided into the synthesizing melt, such that solute diffuses from the synthesizing melt into the growth melt through the at least one opening. The multi-component single crystal having three or more elements, such as a ternary or quaternary single crystal, is grown on the crystal growth seed. Preferably a temperature difference between the thermal barrier and a crystal growth surface over the crystal growth seed is 1° C. or less, and a temperature difference between the thermal barrier and a location in the synthesizing melt where the solute is provided is 20° C. or more.

The crystal growth can be performed in an apparatus containing a heating element and a synthesizing vessel. The heating element may be any suitable heating element which provides heat to the synthesizing vessel. For example, the heating element may comprise a furnace, such as a furnace with resistive heating coils. Alternatively, the heating element may comprise an RF heating element containing RF coils, or a radiative energy heating element, such as a heating element containing one or more heating lamps or flash lamps. The synthesizing vessel may be any vessel for single crystal growth from a melt, such as a crucible made of quartz, pyrolitic boron nitride (pBN) or other thermally tolerant materials which are chemically compatible with the melt and solid materials used in the process. Preferably, the synthesizing vessel is vertically oriented.

A crystal growth seed is located at the bottom of the synthesizing vessel. A multicomponent melt is located in the synthesizing vessel.

A thermal barrier is located in the synthesizing vessel. The thermal barrier may comprise a plate or a second vessel, such as a second crucible, of a smaller diameter than the synthesizing vessel.

One or more openings connect the lower area or zone of the synthesizing vessel to an upper area or zone of the synthesizing vessel. The openings may comprise one or more openings located in the thermal barrier, one or more openings located between the thermal barrier and an internal side wall of the synthesizing vessel, or a plurality of openings located both in the thermal barrier and between the thermal barrier and an internal side wall of the synthesizing vessel.

When the multicomponent melt is present in the synthesizing vessel, the thermal barrier separates the multicomponent melt into a crystal growth melt area or zone (the lower area or zone of the synthesizing vessel) and a synthesizing melt area or zone (the upper area or zone of the synthesizing vessel). The thermal barrier substantially prevents thermal transfer between the synthesizing melt and the growth melt but allows solute transport from the synthesizing melt to the growth melt by solute diffusion through the at least one opening. Therefore, the size of the openings is preferably maintained as small as possible to allow the solute diffusion from the synthesizing melt area to the crystal growth melt area without substantial thermal transfer between the areas.

A solute is provided into the synthesizing melt area. Preferably, the solute is in a solid state. However, the solute may be in a liquid or semi-solid state. Preferably, the solute comprises a material having a higher melting point than that of the multicomponent melt. Preferably, the solute comprises a binary material while the multicomponent melt comprises a ternary or quaternary material having a lower melting point.

In some cases, more that one solute vessels may be provided in the crystal growth apparatus. The plurality of vessels may contain the same or different solute. For example, for a quaternary GaInAsSb melt, separate GaSb and GaAs solutes may be provided from separate vessels into the melt.

Plural solute vessels may be used to form a boule containing two or more regions stacked in the axial direction of the boule which have different characteristics. For example, the plural solute vessels may be used to form a boule with one or more p-n junctions (i.e., a p-type region contacting an n-type region), a boule containing regions of materials with different doping concentration (i.e., heavily doped, medium doped, lightly doped and/or intrinsic regions), a boule containing regions of different single crystal materials, and/or a boule containing regions of different relative concentrations of elements in ternary or quaternary materials, stacked in the axial direction of the boule.

The formation of regions with different characteristics in a boule may be conducted by placing a first solid or liquid solute in a first solute vessel and by placing a second solid or liquid solute with different characteristics from the first solute in a second solute vessel. Then, a boule with different characteristic regions stacked in the axial direction is formed by alternately providing the solute from each vessel into the synthesizing melt. The first and second solute vessels may be separately provided into the synthesizing vessel containing the synthesizing melt by first lowering the first solute vessel into the synthesizing melt containing vessel while the second solute vessel is raised out of the synthesizing melt containing vessel, followed by raising the first solute vessel out of the synthesizing vessel and lowing the second solute vessel into the synthesizing vessel. If desired, there may be three or more solute vessels to form three or more regions having different characteristics. Each solute vessel contains a solute with a different characteristic(s) from the solute(s) in the other solute vessel(s), where the different characteristics may be of the same or different type.

For example, a boule with a p-n junction and different doping concentration regions can be grown as follows. A p-type GaSb melt (doped with zinc to $8 \times 10^{17}$ cm$^{-3}$) is placed in the first solute feeder, an n-type GaSb melt (doped with tellurium to $1 \times 10^{18}$ cm$^{-3}$) is placed in the second solute feeder, a heavily doped p-type GaSb melt (doped with zinc to $5 \times 10^{18}$ cm$^{-3}$) is placed in the third feeder, and a heavily doped n-type GaSb melt (doped with tellurium to $7 \times 10^{18}$ cm$^{-3}$) is placed in the fourth feeder. The liquids are dispensed sequentially one at a time into the synthesizing melt and multiple axial region growth is carried out by lowering the crucible in the cold zone of the furnace. The final structure comprises of $p^+$-p-n-$n^+$ structure with the sequence repeated several times to make a series interconnected photovoltaic device. Thus, the final boule includes regions of different type (different doping type and different dopant concentration type).

A boule with different semiconductor material type regions can be grown as follows. A p-type AlGaSb melt (doped with zinc to $5 \times 10^{17}$ cm$^{-3}$) is placed in the first solute feeder and an n-type GaSb melt (doped with tellurium to $8 \times 10^{17}$ cm$^{-3}$) is placed in the second feeder. The liquids are dispensed sequentially one at a time and multiple axial region growth is carried out by lowering the crucible in the cold zone of the furnace. The final structure comprises a p-n AlGaSb/GaSb structure.

A boule with different relative element concentration type regions can be grown as follows. A $Ga_{1-x}In_xSb$ ($0<x<1$) boule of different x in each axial region is grown. Unintentionally doped p-type $Ga_{0.6}In_{0.4}Sb$ regions are grown on unintentionally doped n-type $Ga_{0.45}In_{0.55}Sb$ regions. In this structure, the corresponding melts in the solute feeder vessels are not doped with any impurities. The p- and n-type doping in the final layers takes place as a result of native defects which are electrically active. It is well known that $Ga_{1-x}In_xSb$ is p-type for $x<0.5$ and n-type for $x>0.5$ without any dopants [see references in P. S. Dutta, H. L. Bhat and Vikram Kumar, The Physics and Technology of Gallium Antimonide: an Emerging Optoelectronic Material, Applied Physics Reviews, J. Appl. Phys. 81, 5821-5870 (1997)].

The technique of the WO2006/028868 publication allows high growth rate of at least 100 microns per hour.

In some cases, the upper portion of the boule can be polycrystalline. If the presence of such polycrystalline portion, it can be removed by slicing the boule in the direction perpendicular to the direction of the growth.

Upon the completion of the crystal growth, the boule can be sliced or planarized substantially parallel to the direction of the growth to form one or more edge surfaces. Each of the edge surfaces can be then polished. Preferably, the edge surfaces are optically polished to atomic flatness using a damage-free lapping and polishing process. One or more of the edge surface that serves as an illumination surface can then coated with antireflection and surface passivation coating. Two end surfaces of the boule, i.e. the bottom and the top surfaces of the boule, can be sliced, polished and contacted with electrical connections, such as metal wires.

Figure 4:
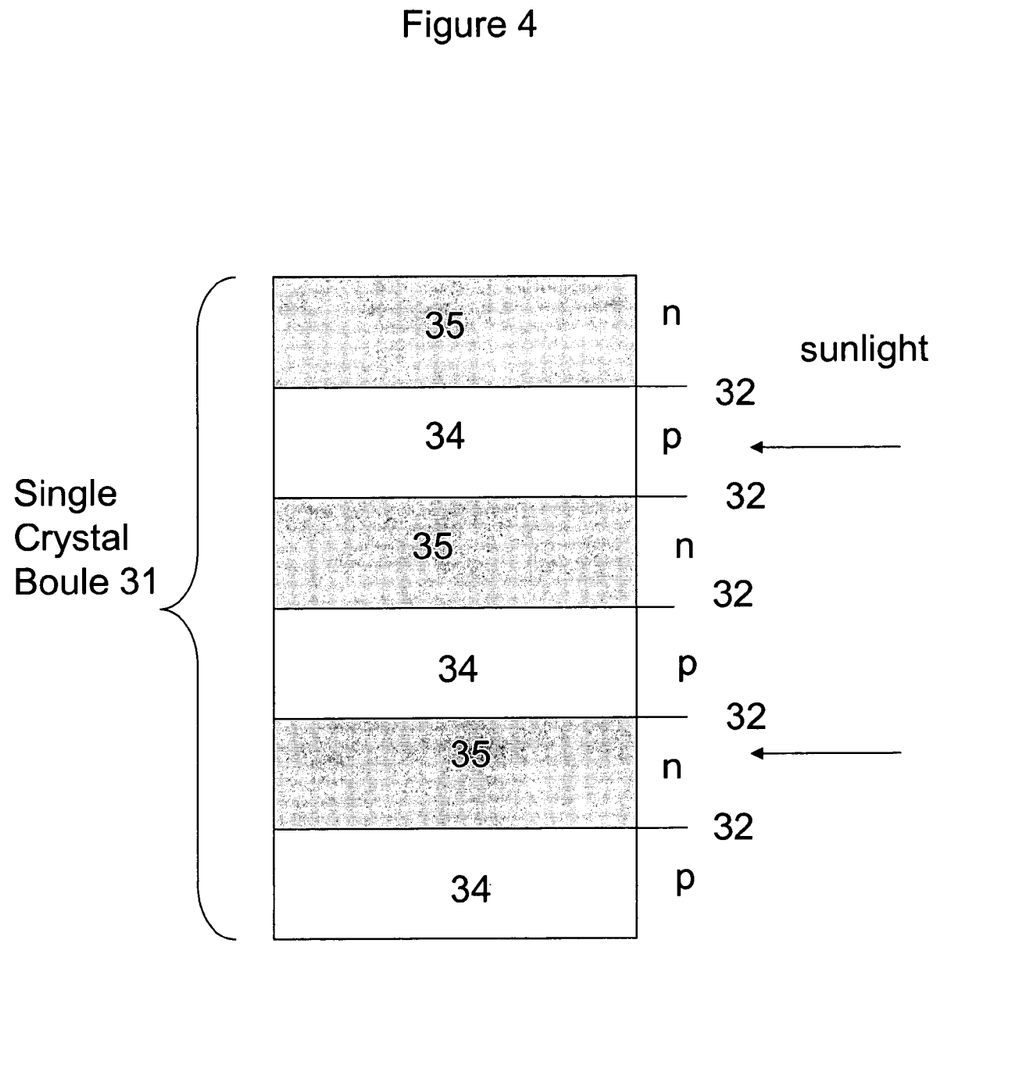
FIG. 4 illustrates an edge illumination photovoltaic device comprising a single crystal boule according to one embodiment of the invention.

FIG. 4 schematically depicts a photovoltaic device that can be fabricated using the third embodiment. The single crystal boule 31 has multiple interchanging p-type 34 and n-type 35 layers forming p-n junctions 32. Electrical connections are provided to the upper and lower surface of the crystal boule. Arrows show the direction of sunlight illumination. Each p-n junction composed of one p-type and one n-type layer can have the same or different composition as the other p-n junctions to form a multi-junction solar cell having junctions of the same or different peak sensitivity to different sunlight wavelengths.

According to a fourth embodiment, an edge illuminated photovoltaic device comprises an amorphous-crystalline p-n junction. The edge illumination photovoltaic device is formed by obtaining a wafer as discussed in the first embodiment. Preferably, the multicomponent semiconductor is doped with a first conductivity type dopant. After obtaining the wafer, a layer of amorphous semiconductor such as CdS, ZnS or ZnO is disposed on one surface of the wafer. Preferably, the amorphous semiconductor is doped with a second dopant which of opposite conductivity type to the first conductivity type dopant. The amorphous semiconductor can be deposited by a low temperature deposition technique, such as chemical bath deposition or thermal evaporation. The amorphous semiconductor deposition can be carried out at a temperature from about 40° C. to about 400° C. for a period of time ranging from about 15 min to about 90 min. The interface between the multicomponent single crystal semiconductor and amorphous semiconductor layer defines a p-n junction. One or more metallic layers are disposed on the side of the wafer not exposed to the amorphous semiconductor and on the surface of the amorphous semiconductor layer. These metal layers serve as ohmic contacts. The materials and the deposition processes for such metallic layers are discussed in the first embodiment.

If the final photovoltaic device has multiple p-n junctions, individual single p-n junction cells are stacked on each other with an interposed bonding layer between their ohmic contact layers. The stacked structure is then annealed to form an integrally bonded structure similarly to the procedure disclosed for the first embodiment.

Again similarly to the first embodiment, the integrally bonded structure is sliced or planarized to expose one or more edge surfaces that are substantially non parallel, preferably substantially perpendicular, to the end surfaces of the structure. At least one of the edge surfaces can serve as an illumination surface. One of the other edge surfaces can serve as a heat dissipating surface. The procedures for forming an illumination surface and heat dissipating surface disclosed for the first embodiment are applicable for this embodiment as well.

The last step in the device's fabrication includes providing electrical connections such as metal wires to the end surfaces of the device.

Figure 5:
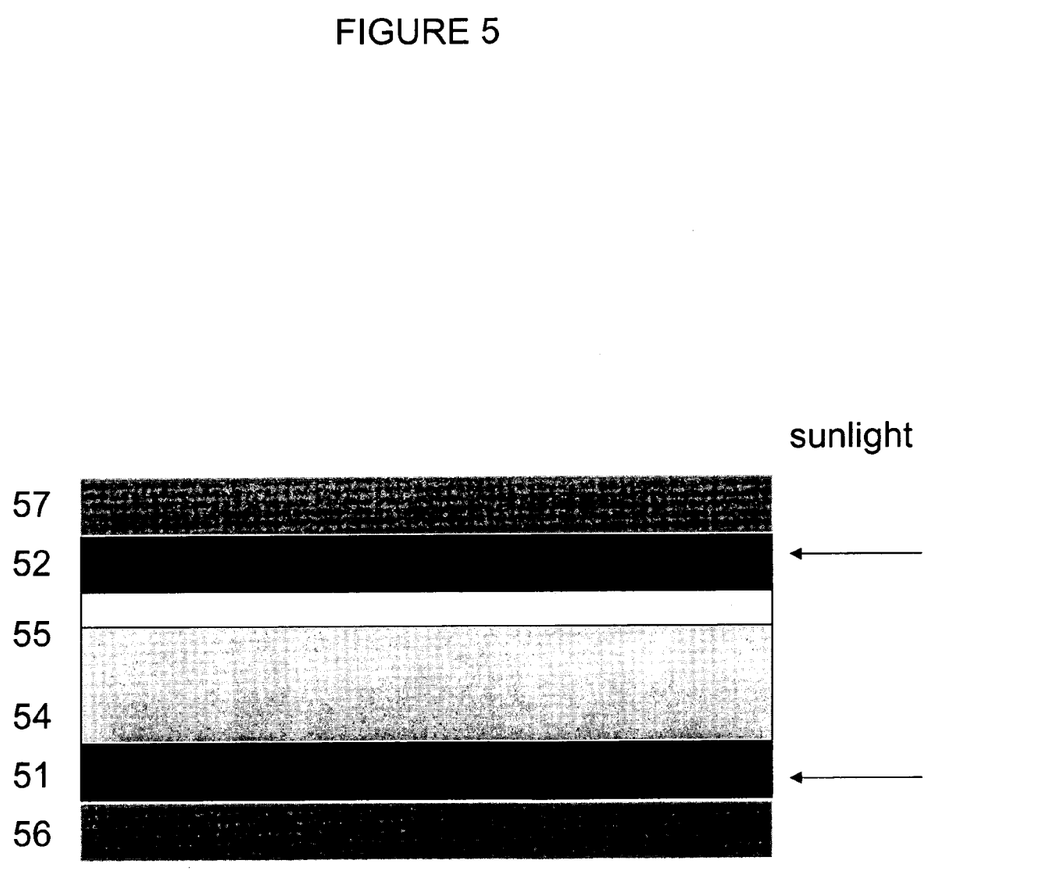
FIG. 5 illustrates an edge illumination photovoltaic device according to one embodiment of the invention.

FIG. 5 schematically depicts a photovoltaic device that can be fabricated using the above method. A layer of amorphous semiconductor 55 deposited on the upper surface of a single crystal wafer 54. One or more metal layers 52 are deposited on the layer 55, while one or more metal layers 51 are deposited on the lower surface of the wafer 54. Bonding layers 56 and 57 are optionally deposited on metal layers 51 and 52 respectively for formation of a multijunction device. The direction of illumination is indicated by the arrows.

Fabrication of an edge illumination device according to the embodiments of the present invention can be performed without utilizing photolithography or costly high temperature processing techniques, such as an epitaxial layer growth. Methods of the present invention allow performing the device's fabrication at a temperature below about 600° C. The disclosed fabrication methods can be suitable for high volume low-cost manufacturing as the cost of the device can be estimated to be in the order of $0.05-0.20/W as compared to the $3.00/W for traditional flat plate photovoltaic devices. The photovoltaic devices fabricated according to these methods can be utilized in a variety of photovoltaic and thermophotovoltaic systems, including high intensity solar concentrator systems for large scale building integrated or stand alone applications. Thus, a focusing lens or a focusing reflector can be provided above the illumination surface of the device.

Although the invention has been described in detail for the purpose of illustration, it is understood that such detail is solely for that purpose, and variations can be made therein by those skilled in the art without departing from the spirit and scope of the invention which is defined by the following claims.

All of the publications, patent applications and patents cited in this specification are incorporated herein by reference in their entirety.

What is claimed is:

1. A method of making an edge illumination photovoltaic device, comprising:
   (i) forming two or more p-n junctions without using an epitaxial layer deposition process in at least one multicomponent semiconductor region having a first end surface and a second end surface substantially parallel to said first end surface;
   (ii) forming an illumination surface in the at least one region, wherein the illumination surface is located substantially non-parallel to the first end surface and the second end surface; and
   (iii) forming a first electrode which electrically contacts the first end surface and a second electrode which electrically contacts the second end surface;
   wherein the step of forming two or more p-n junctions comprises providing a single crystal boule which comprises the two or more p-n junctions.

2. The method of claim 1, wherein said forming an illumination surface comprises:
   slicing or planarizing the at least one region substantially non-parallel to the first end surface and to the second end surface to form the illumination surface; and
   polishing the illumination surface.

3. The method of claim 2, further comprising: slicing or planarizing the at least one region substantially non-parallel to the first end surface and to the second end surface to form a heat sink surface opposite to the illumination surface, depositing an antireflection coating on the illumination surface and depositing a heat dissipating coating on the heat sink surface.

4. The method of claim 1, further comprising growing the boule from a melt such that an as-grown boule contains the two or more p-n junctions in an axial direction of the boule.

5. The method of claim 1, wherein the multicomponent semiconductor is a binary semiconductor, a ternary semiconductor or a quaternary semiconductor.

6. The method of claim 1, wherein the multicomponent semiconductor is selected from a group consisting of GaSb, GaAs, InP, GaInAs, GaInSb, GaInP, AlGaAs, AlGaSb, AlGaP, AlInAs, AlInSb, AlInP, InAsSb, InAsP, InSbP, GaAsSb, GaAsP, GaSbP, AlAsSb, AlAsP, AlSbP, ZnTeSe, ZnTeS, ZnSeS, CdTeSe, CdTeS, CdSeS, HgTeSe, HgTeS, HgSeS, ZnCdTe, ZnCdSe, ZnCdS, ZnHgTe, ZnHgSe, ZnHgS, CdHgTe, CdHgSe, CdHgS, GaInAsSb, GaInAsP, GaInSbP, AlGaAsSb, AlGaAsP, AlGaSbP, AlInAsSb; AlInAsP, AlInSbP, ZnCdTeSe, ZnCdTeS, ZnCdSeS, HgCdTeSe, HgCdTeS, HgCdSeS, ZnHgTeSe, ZnHgTeS, and ZnHgSeS.

7. The method of claim 1, wherein said forming an illumination surface comprises:
   slicing or planarizing the at least one region substantially non-parallel to the first end surface and to the second end surface to form the illumination surface; and
   polishing the illumination surface to atomic flatness.

* * * * *